United States Patent
Christians et al.

(10) Patent No.: US 11,760,277 B2
(45) Date of Patent: Sep. 19, 2023

(54) VEHICLE BODY PART AND METHOD FOR PRODUCING A VEHICLE BODY PART

(71) Applicant: SONO MOTORS GMBH, Munich (DE)

(72) Inventors: Jona Christians, Munich (DE); Laurin Hahn, Munich (DE)

(73) Assignee: SONO MOTORS GMBH, Munich (DE)

(*) Notice: Subject to any disclaimer, the term of this patent is extended or adjusted under 35 U.S.C. 154(b) by 0 days.

(21) Appl. No.: 16/633,743

(22) PCT Filed: Jul. 25, 2018

(86) PCT No.: PCT/EP2018/070232
§ 371 (c)(1),
(2) Date: Jan. 24, 2020

(87) PCT Pub. No.: WO2019/020718
PCT Pub. Date: Jan. 31, 2019

(65) Prior Publication Data
US 2020/0269774 A1  Aug. 27, 2020

(30) Foreign Application Priority Data
Jul. 26, 2017  (EP) .................................... 17183350

(51) Int. Cl.
*B60R 13/04* (2006.01)
*B60R 13/08* (2006.01)
(Continued)

(52) U.S. Cl.
CPC .............. *B60R 13/04* (2013.01); *B60R 13/08* (2013.01); *B62D 25/02* (2013.01); *B62D 25/06* (2013.01);
(Continued)

(58) Field of Classification Search
CPC ... B60L 53/51; B60L 8/00; B62M 6/85; H02J 7/35; Y02E 10/50; Y02T 10/82;
(Continued)

(56) References Cited

U.S. PATENT DOCUMENTS 8,158,450 B1 * 4/2012 Sheats ................. H01L 31/0516
438/57
2002/0139412 A1  10/2002 Reimer
(Continued)

FOREIGN PATENT DOCUMENTS

CN     103387011 A    11/2013
CN     205168031 U *  4/2016  ............... B60B 3/00
(Continued)

OTHER PUBLICATIONS

Kogler, "Solar Cell Composite and Solar Unit Comprising Said Solar Cell Composite", Feb. 21, 2007, German Patent Office/European Patent Office, EP1755170A2 (Year: 2007).*
(Continued)

*Primary Examiner* — Dennis H Pedder
*Assistant Examiner* — Joyce Eileen Hill
(74) *Attorney, Agent, or Firm* — Jacob Eisenberg

(57) ABSTRACT

The present disclosure relates to a vehicle body part of a motor vehicle having at least one frame component and at least one trim part which is arranged thereon, wherein the trim part has at least one cutout which is closed off in an essentially airtight and watertight fashion and has at least one solar cell which is arranged therein and has the purpose of generating electrical energy, and wherein the outer side of the trim part has, at least in a region adjacent to the at least one solar cell, an outer shape which is curved three-dimensionally and which is provided for forming a part of the external contour of the motor vehicle in the installed posi- (Continued)

tion on said motor vehicle. Furthermore, the present disclosure relates to a method for producing a vehicle body part.

11 Claims, 8 Drawing Sheets

(51) Int. Cl.

| | | |
|---|---|---|
| *B62D 25/02* | (2006.01) | |
| *B62D 25/06* | (2006.01) | |
| *B62D 25/08* | (2006.01) | |
| *H01L 31/048* | (2014.01) | |
| *B60K 16/00* | (2020.01) | |
| *H02J 7/35* | (2006.01) | |

(52) U.S. Cl.
CPC ............. *B62D 25/08* (2013.01); *B60K 16/00* (2013.01); *H01L 31/048* (2013.01); *H02J 7/35* (2013.01); *Y02E 10/50* (2013.01); *Y10T 29/49* (2015.01)

(58) Field of Classification Search
CPC ......... Y10T 29/49; H01L 31/04; H02S 20/00; H02S 30/10; B60K 16/00; B62D 25/06
USPC ............ 296/187.01, 214, 211; 136/244, 251, 136/291; 204/196.27; 180/2.2
See application file for complete search history.

(56) References Cited

U.S. PATENT DOCUMENTS

| | | | | |
|---|---|---|---|---|
| 2011/0226312 | A1* | 9/2011 | Bohm | B62D 25/06 136/251 |
| 2014/0251415 | A1* | 9/2014 | Inaba | H01L 31/048 438/66 |

FOREIGN PATENT DOCUMENTS

| | | | | |
|---|---|---|---|---|
| DE | 8813137 | U1 | 3/1989 | |
| DE | 102008049890 | A1 * | 4/2010 | ....... B29C 45/14336 |
| DE | 102010013784 | A1 | 10/2011 | |
| EP | 1245418 | A2 | 10/2002 | |
| EP | 1755170 | A2 * | 2/2007 | ....... B32B 17/10018 |
| EP | 1820821 | A1 * | 8/2007 | ............. A43B 13/04 |
| GB | 2437946 | A | 11/2007 | |
| JP | 2012104626 | A | 5/2012 | |
| JP | 2012222215 | A | 11/2012 | |
| JP | 2016197613 | A * | 11/2016 | |
| JP | 2016207849 | A | 12/2016 | |
| JP | 2017092067 | A | 5/2017 | |
| KR | 20170070683 | A * | 6/2017 | |

OTHER PUBLICATIONS

Chen et al., "Novel electrombile wheel hub", Nov. 12, 2015, Publisher: European Patent Office, Edition: CN205168031A (Year: 2015).*
Su et al., "Electricity charging system for vehicle", Date Published: Jun. 22, 2017, Publisher: Korean Patent Office, Edition: KR20170070683A (Year: 2017).*
Boehm et al., "Surface component for e.g. sliding roof", Date Published: Apr. 22, 2010, Publisher: German Patent Office, Edition: DE102008049890A1 (Year: 2010).*
Akita, "Solar Panel", Date Published: Nov. 24, 2016, Publisher: Japanese Patent Office, Edition: JP2016197613A (Year: 2016).*
Translation of JP 2017092067 A.
Translation of EP DE 102010013784 A1.
Translation of DE 8813137 U1.
Translation of JP 2012222215 A.
Translation of CN 103387011 A.
Translation of JP 2012104626 A.
Translation of JP 2016207849 A.

* cited by examiner

VEHICLE BODY PART AND METHOD FOR PRODUCING A VEHICLE BODY PART

CROSS REFERENCE TO RELATED APPLICATIONS

This application is a national phase application of International Application PCT/EP2018/070232, filed Jul. 25, 2018, and claims the priority of European Patent Application EP20170183350, filed Jul. 26, 2017, the content of both of which is incorporated herein by reference.

FIELD

The present disclosure relates to a vehicle body part of a motor vehicle, in particular a vehicle body part of a passenger vehicle. The present disclosure further relates to methods for producing a vehicle body part of a motor vehicle. The present disclosure may also relate to a motor vehicle with one or several such vehicle body parts.

BACKGROUND

Motor vehicles often have a so-called self-supporting vehicle body. Respective vehicle body parts forming an external contour of the motor vehicle simultaneously have a structurally supportive function. An additional supporting frame structure, such as for example pipes holding respective trim elements, may be omitted in this way. In such self-supporting vehicle body respective solar cells may for supplying an energy system of the motor vehicle may however be integrated only with difficulty, in particular as solar cells are normally brittle and/or may support only small structural loads without suffering damage. For this reason, solar cells are normally fitted to self-supporting vehicle bodies only retrospectively, for example in the form of planar panels. As self-supporting vehicle bodies often also have a curved external contour, respective solar panels usually protrude from respective vehicle body parts with such an integration and disadvantageously influence the aerodynamics of the motor vehicle.

With a classic vehicle body construction with coachwork, where respective trim elements of the vehicle body are fitted to a structurally supportive frame, an integration of solar cells may also be complex. The solar cells must for example be fitted on the outer side of the trim parts here. The respective solar cells may then protrude from the external contour of the motor vehicle here as well and disadvantageously influence the aerodynamics of the motor vehicle.

The integration of solar cells into the vehicle body of motor vehicles is often also relatively expensive, wherein the replacement of the solar cells may also be difficult under certain circumstances (such as when these are damaged).

It is a problem of the present disclosure to provide a vehicle body part for a motor vehicle where respective solar cells are integrated particularly advantageously. It is further a problem of the present disclosure to provide a method for producing a vehicle body part where a solar cell is integrated particularly advantageously.

SUMMARY

These problems are solved according to the present disclosure by the subject matter of the independent patent claims. Advantageous embodiments with expedient further developments of the present disclosure are listed in the respective subclaims, wherein advantageous embodiments of the vehicle body part should be considered to constitute advantageous embodiments of the production method and vice versa.

A first aspect of the present disclosure relates to a vehicle body part of a motor vehicle with at least one frame component and at least one trim part arranged thereon. The trim part preferably has at least one essentially airtight and substantially watertight closed cutout with at least one solar cell arranged in the same for generating electric energy. The outer side of the trim part preferably has a three-dimensionally curved outer shape at least in a region adjacent to the at least one solar cell, which is designed in such a way that it forms part of an outer vehicle contour in an installed position on the motor vehicle.

The trim part preferably has a plurality of solar cells. At least one, several or all of these solar cells may be substantially planar.

The motor vehicle preferably has a three-dimensionally curved outer vehicle contour. The trim part preferably forms part of this three-dimensionally curved outer vehicle contour in an installed position on the motor vehicle. Respective solar cells preferably form no edges or protruding parts on the outer skin of the motor vehicle in respective cutouts here. The aerodynamics of the vehicle body part with integrated solar cells may be especially favorable in this way. A curvature radius of the outer shape may be not less than 10 cm, not less than 20, or not less than 30 cm in the area of the trim part with a three-dimensionally curved outer shape. All curvature radii of the three-dimensionally curved outer shape in this area may optionally be no less than 10 cm, no less than 20, or no less than 30 cm. Particularly preferably respective curvature radii of the three-dimensionally curved outer shape in this area are no less than 60 cm, no less than 70, or no less than 80 cm.

The outer side of the vehicle body part may be defined by an installed position on the motor vehicle, wherein the outer side preferably faces away from the vehicle towards an outer side in the installed position. Alternatively or additionally the outer side of the vehicle body part may also be defined by the respective solar cells. The outer side of the vehicle body part is in this case preferably the side from which the solar cells may be excited by sunlight entering from the outer side for generating electric energy. The outer side of the vehicle body part preferably faces away from an interior of the motor vehicle in the installed position.

An outer side of the trim part may be designed at least partly transparent, in particular in the area of the at least one cutout and/or above the solar cell or cells so that light may reach the solar cells easily. Respective cutouts may be designed as hollows in the trim part. The one or several solar cells may be encapsulated in the cutout.

The fact that the cutout is closed substantially watertight and/or airtight means that the respective solar cells may be protected against external environmental influences.

The trim part preferably has one or more electric connections for connecting and/or controlling the solar cells. These connections are preferably not provided on the outer side of the trim part. Corresponding connections may for example be provided on an inside of the trim part facing the interior and/or along an outer edge of the trim part, which connects the inside and the outer side. Passages for electrical connections may for example form an access to the interior of the cutout on a side facing the interior. These passages are preferably watertight and/or airtight. This is however not essential, as an ingress of moisture and suchlike could also be prevented by the substantially closed outer skin of the motor vehicle and/or respective trim elements of the interior.

Respective seals may however also be provided at such passages, so that electric lines from the solar cells to an energy store of the motor vehicle will for example allow no ingress of water into the interior of the cutout. A film and/or mass surrounding the solar cell, in particular a plastic film or plastic mass, may under certain circumstances itself already supply an adequate sealing of lines provided during the production of the vehicle body part.

It may be envisaged that several solar cells are arranged together in a respective cutout. Alternatively it may also be envisaged that one substantially closed cutout is provided per solar cell. With several solar cells per cutout the trim part is particularly cost effective to produce. The arrangement of the solar cells in several separate cutouts, or even of each solar cell in a separate cutout may mean that other solar cells may continue to be protected against environmental influences even if the tightness of one cutout has been compromised, for example through a collision with an obstacle. A construction with a plurality of cutouts, in each of which a plurality of solar cells is arranged, may optimize production costs and robustness of the trim part with regard to protecting the solar cells.

The frame component may be the essential structurally supportive component of the vehicle body part, which carries and supports the trim part, in particular in the installed position on the motor vehicle. The trim part may have a structurally supportive proportion that is considerably smaller in comparison. Respective loads may for example be absorbed at 70%, 90% or more by the frame component and at just 30%, 10% or less by the trim part. With a corresponding connection of the trim part with the frame component and/or a corresponding material selection for the trim part it may however also be envisaged that the trim part may absorb higher structural loads. The vehicle body part may be designed in the way of a self-supporting vehicle body. The frame component may for example be part of a frame construction of the motor vehicle. The frame component may be curved three-dimensionally and may under certain circumstances also form part of the external contour of the motor vehicle. In particular an outer surface of the frame component may also have a three-dimensionally curved outer shape, which is designed in such a way that it forms a further part of the outer vehicle contour in the installed position on the motor vehicle. The frame component may for example be designed as a three-dimensionally curved steel, aluminum, GRP or CFRP construction. With the vehicle body part described here GRP (fiberglass-reinforced plastic) may also always be used as a material instead of CFRP (carbon fiber-reinforced plastic). The strength of CFRP is particularly high and its weight particularly low, whilst GRP is cheaper in comparison.

The trim part and the frame component may for example be glued to each other. The adhesive and/or a respective adhesive joint may be designed in such a way here that they may compensate different thermal expansions of the frame component and the trim part, in particular due to the use of different materials.

The vehicle body part, in particular the trim part, may be color painted on a side facing away from incoming sunlight for energy generation in the installed position. This side may also be described as the inside of the trim part and/or equal a side facing the interior of the motor vehicle. A side of the trim part that faces the interior may therefore for example be color painted. In this way the motor vehicle may appear color painted from the outer side, whilst sunlight for generating energy may nevertheless fall onto the solar cells. Alternatively respective dyed films may also be provided for giving the motor vehicle a specific color. The frame component may also be color painted or covered with a colored film layer. Painting and/or film wrapping the frame component may also protect the same well against damage such as for example scratches.

An outer side of the vehicle body part, in particular an outer side of the trim part, may be painted with a clear paint layer, preferably at least in the area of respective solar cells and/or respective cutouts. This clear paint layer may also be described as a hard coating. Incoming sunlight is not blocked, or blocked only to a small extent in this way, whilst a smooth, robust and/or consistent surface of the trim part may be created on the outer vehicle contour and/or the outer vehicle skin at the same time. The hard coating is preferably already applied to respective elements of the trim part before these are deformed.

A three-dimensionally curved outer shape and/or external contour may be a three-dimensionally curved surface. In particular this three-dimensionally curved shape may have a continuous course. The three-dimensionally curved shape may be free from edges, steps and/or sharp angles.

As already described the trim part of the vehicle body part according to the present disclosure may have an outer side, an inside and an edge connecting the outer side and the inside, wherein at least the outer side is preferably three-dimensionally curved. The surface of the outer side is preferably larger than the surface of the edge, preferably at least by a factor of no less than five, no less than by a factor of ten, or no less than by a factor of fifty.

The above design of the vehicle body part also offers the advantage that a frame component as well as a trim part may have a freely shaped external contour, which may create a particularly aerodynamically advantageous motor vehicle, whilst solar cells that have a standardized shape and/or are at least partly pre-assembled may be received in respective cutouts. In this way these solar cells may be produced or acquired particularly cost effectively whilst no or only few restrictions nevertheless arise during the design of the external contour of the motor vehicle.

In particular the solar cells may be substantially inflexible and/or rigid and/or flat solar panels. These may be easily integrated into the vehicle body of the motor vehicle whilst the external contour may nevertheless be designed substantially freely.

The trim part preferably has a plurality of substantially planar solar cells, which are electrically connected with each other (for example no less than 5, no less than 10, no less than 20, or no less than 30 separate solar cells). In this way cost effective standard solar cells and/or pre-assembled solar cells may be used and the available outer surface of the motor vehicle may be simultaneously used for an especially large number of solar cells. Respective solar cells may also be better adapted to a course of the edge of the trim part here. The trim part may further be especially flat here, as respective cutouts must compensate only for a small curvature of the external contour with their respective height transverse to a longitudinal expansion direction of the trim part in the area of each individual solar cell. Respective individual solar cells may for example also be offset from each other in a direction transverse to a main expansion plane of the trim part in order to follow by this offset a curvature of the external contour of the motor vehicle at least in part. The trim part may for example also have several strings of solar cells here, which are already electrically connected with each other prior to insertion into respective cutouts. These respective strings of solar cells may each be arranged in a jointly allocated cutouts. The strings are thus especially easy to install.

The outer side of the trim part preferably abuts substantially flush with the outer side of the frame component. Such a construction is especially aerodynamically advantageous and enables an especially harmonic overall impression of the external contour of the motor vehicle.

The trim part preferably comprises a support element curved at least in some areas according to the curved outer shape and/or the curved outer vehicle contour, in or on which the at least one solar cell is arranged. The at least one support element of the trim part may be made of a plastic, for example a transparent plastic. Possibilities for example include polycarbonate. Polycarbonate may be easily shaped in an advantageous way and is also a good insulator against electrical energy. It may be omitted to additionally electrically insulate the solar cells and/or respective electric lines. The support element may in particular adopt a structurally supportive function for respective solar cells. One or more support elements may form the respective cutouts of the trim part for this purpose, to which the respective solar cells may be fitted.

The support element preferably has no less than one structurally supportive support component, for example no less than one disc. The support element is preferably formed by no less than two discs, wherein an outer one of the discs forms the outer side of the trim part and an inner one of the discs an inside facing away from the outer side, wherein the cutout is formed between the two discs. Respective cutouts may be particularly easily formed in the trim part in this way. It may also be possible to deform the respective discs only slightly for forming a cutout like this.

The disc/s may be designed as plates and/or formed from level plates. One disc or both discs may in particular be produced in that a respective planar element (and/or a respective planar plate) is domed by means of a deformation process. Both discs are preferably produced from planar plates, which are domed for producing the support elements. The discs may be formed from a polycarbonate material and may therefore also be described as polycarbonate discs. The respective polycarbonate discs may have a thickness of for example less than 5 mm here, preferably of 2.5 mm or less. Respective discs (for example polycarbonate discs) may also be colored here, in particular one of the respective discs facing away from incoming sunlight (for example a polycarbonate disc). Alternatively respective discs (for example polycarbonate discs) may also be equipped with a colored hard coating. Materials other than polycarbonate may also be used, for example glass.

The vehicle body part may include different materials depending on its deployment location. Several vehicle body parts according to the present disclosure may in particular be provided on a vehicle, wherein these vehicle body parts—in particular their respective frame component—may be produced from no less than two different materials depending on their deployment location. The vehicle may therefore have a first frame component, which is made from a first material selected from the following group: three-dimensionally curved steel, aluminum, GRP or CFRP constructions. The vehicle may further have a second frame component, which is made from a second material selected from this group, wherein the second material is different from the first material.

The two discs are preferably connected with each other via a distancer, for example with a double-sided acrylic adhesive tape. The distancer (such as the acrylic adhesive tape) may serve for fixing the respective discs to each other, in particular during the production of the trim part, but also as sealing for a respective cutout along the circumferential edge of the trim part. The discs of the support element may lie against each other at least in some areas and/or are adjacent to each other. An edge of the respective discs around the cutout may for example lie against each other and delimit the same in this way.

A gap between the at least one solar cell and respective walls delimiting the associated cutouts of the trim part may be filled with a silicone gel. The respective cutouts may be sealed by means of acrylic, in particular double-sided acrylic adhesive tape for this. The solar cells may be encapsulated by means of the silicone gel in order to protect them especially well against environmental influences. The silicone gel may simultaneously be substantially light permeable, so that an efficiency of the solar cells is not affected, or only a little. The silicone gel may in particular prevent an ingress of air and/or water into the cutout of the trim part and dampen vibration. Silicone gel may also be understood and/or used as a sealant for the cutouts.

The cutout may be delimited by one or more films arranged on the support element, in particular thermoplastic films (such as polyurethane films), which are closed and/or connected with each other in a way such as to delimit a hollow for sealing the cutout. Suitable film materials are for example PTFE, ETFE, cross-linked and non-cross-linked thermoplastic elastomers (TPE), elastomers, ethylene vinyl acetate copolymers (EVA), two-component silicones, thermoplastic polyurethanes (TPU), thermoplastic olefins (TPO), polyvinylbutyral (PVB), thermoplastic silicone elastomers (TPSE), ionomers and modified polyolefin. The delimitation of the cutout with the film may also be realized only in some areas here. A thermoplastic polyurethane film may also be described as a TPU film.

Respective cutouts of the trim part may be sealed particularly well by means of films, in particular respective plastic films. Sealing may be realized by means of such films additionally or alternatively to acrylic adhesive tape. The solar cells may in particular also be encapsulated between films, in particular between two TPU films, preferably by means of two welded films. A respective film may however also be directly applied to a corresponding support (such as a corresponding disc) or frame component. The film itself may therefore form the outer side or inside of the trim part, whilst the support or frame component forms the opposite inside or outer side. The one or several films may form a structurally non-supportive part here, which may be supported by a structurally supportive component, in particular the support component (i.e. the not less than one disc). The film may cover the frame and/or support component in the direction of the outer side of the vehicle body in the installed position. The cutout may be closed off from the outer side by the film here. Alternatively the film may cover the frame and/or support component in the direction of the inside of the vehicle body. The cutout may be closed off from the inside by the film here.

The respective films may also be used for connecting the two discs of the support element with each other here. One or several TPU films may for example be arranged between two polycarbonate discs and melted through heating so far that these two discs are firmly connected with each other. Alternatively or additionally a film, in particular the film arranged on the outer side in the installed position of the vehicle body part, may also replace one of the discs.

The frame component preferably has a receiving area with a step, wherein the trim part is arranged in the receiving area.

The trim part may be held especially securely on a step. The step may also constructively facilitate that an outer side of the frame component follows flush from an outer side of the trim part in a simple way here. A step may simultaneously provide an expansion joint for the compensation of different thermal expansion coefficients especially easily. The trim part is preferably held on the step, in particular on an inside support surface adjacent to the inside of the trim part. The frame component may therefore form a holding frame, wherein this holding frame is at least partly milled and/or may be made of CFRP or GRP. The frame component may frame the trim part at least in sections (such as across at least 50%, at least 70% or at least 90% of the length, related to the length of the edge of the trim part) or may even frame the outer side circumference completely, for example in the way of a picture frame. The receiving area may for example be designed as a receiving opening, through opening, an indentation and/or a cutout. The frame, in particular the receiving area, may have an at least sectional or completely continuous rear wall and/or struts. The trim part may additionally be supported against this rear wall along its inside and/or against these struts, such as by means of a foam rubber.

The step of the frame component is preferably substantially of a Z-shaped design, wherein an upper leg of the Z-shaped step forms the outer side of the frame component, which may follow on from the trim part substantially flush, and wherein a lower leg of the step forms a support surface for the trim part. The Z shape preferably has an internal angle of 90°, which means it is designed in the shape of a double L. Such a shape is especially cost effective to manufacture. The Z shape may however also have angles that differ from these in order to be able to adapt the step especially well to a curve of the external contour. The support surface may in particular serve for holding the trim part. A leg connecting the upper and lower leg may form a side delimitation of the receiving opening of the frame, in which the trim part is arranged. The lower leg and/or the leg connecting the lower and the upper leg may serve as fixing surfaces, in particular adhesive surfaces, for fixing the trim part to the frame component. A respective gap between the legs of the step and the trim part may be filled with an adhesion here, which may in particular compensate for a compensation of different thermal expansions, for example by means of acrylic. Alternatively or additionally a vehicle body adhesive tape may be provided, for example along the inside of the trim part. The adhesion may be realized in the way of a jointing. Alternatively or additionally remaining gaps may be filled with silicone.

The frame component may be covered with a film, in particular a film located on the outer side in the installed position. This film may be made from a colored and/or multi-colored plastic for coloring the motor vehicle. In an area of a bonding point of the trim part the film may be removed for an especially safe connection here. If the frame component has a spatial overlap with the trim part, for example in that the receiving area has an at least partial or completely continuous rear wall and/or struts (such as when the receiving area is designed in the form of a trough for holding the trim part) the rear wall and/or the struts may be painted and/or equipped with colored film (for example glued to the same). A correspondingly colored frame component may therefore let a motor vehicle appear colored for a viewer from the outer side of the same, with an otherwise substantially colorless and transparently designed trim part, also in the area of the trim part. A colored film on the frame component on the side facing the trim part is in particular suitable for this, which is preferably cut free in the area of respective bonding points.

The vehicle body part may have at least one connection box (a so-called "junction box"). The connection box preferably has at least one blocking diode and/or at least one bypass diode. The connection box is preferably fitted on the inner side of the trim part, the frame component and/or the vehicle body part in an installed position.

A further aspect of the present disclosure relates to motor vehicle with a vehicle body part according to the first aspect of the present disclosure. The features and advantages resulting from the vehicle body part according to the first present disclosure aspect may be found in the description of the first present disclosure aspect, wherein advantageous embodiments of the first present disclosure aspect should be considered advantageous embodiments of the motor vehicle and vice versa.

A further aspect of the present disclosure relates to a method for producing a vehicle body part of a motor vehicle. A vehicle body part according to the first aspect of the present disclosure may in particular be produced with this method. The features and advantages resulting from the first present disclosure aspect may be found in descriptions of the first present disclosure aspect, wherein advantageous embodiments of the first present disclosure aspect should be considered as advantageous embodiments of the second present disclosure aspect and vice versa.

The method according to the present disclosure may comprise one or more of the following steps:

providing a trim part blank;

generating at least one essentially airtight and substantially watertight closeable cutout, in which at least one solar cell is arranged, by means of which electrical energy may be generated from the finished vehicle body part;

closing the at least one cutout of the trim part blank with the at least one solar cell arranged in or on the same for forming a finished trim part;

providing a frame component with a receiving area for the trim part;

arranging the trim part in the receiving area of the frame component.

An outer side of the trim part preferably has a three-dimensionally curved outer shape in at least one region adjacent to the at least one solar cell here, which is designed in such a way that it forms part of an outer vehicle contour in the installed position on the motor vehicle, in particular a part of a three-dimensionally curved outer vehicle contour. The trim part blank is preferably deformed for this purpose. Deforming may take place whilst heating the trim part blank. The trim part blank may comprise at least one polycarbonate disc. This polycarbonate disc may preferably be equipped with a protective hard coating in an immersion bath, which is colorless and transparent and is suitable for a subsequent deforming.

The receiving area preferably has a step. The trim part is advantageously arranged in the receiving area in such a way that it is held on the step and/or in that the outer side of the trim part follows an outer side of the frame component substantially flush.

Closing the respective cutout may preferably be realized by means of autoclaving, for example in that the trim part blank is heated in a vacuum bag at 120° for 3 hours. Therein, underpressure may be applied inside the cutout and/or overpressure outside of the same. Due to autoclaving respective cutouts may be especially free from respective contamination such as dirt, air and/or water, which means that the working life of the solar cells and/or their degree of efficiency may be especially high.

A process described as a lamination process or lamination within the solar cell and solar module production industry may also be used as an alternative to autoclaving. For this a so-called laminator may for example be used, in which a vacuum may be generated. External pressure is also applied here in particular compared to autoclaving, for example with a molding tool. Respective blanks may for example be placed on a heated tool table and pressed into a mold with the aid of a tool there. Respective layers may also be evacuated here, for example in that they are arranged in the laminator and compressed under a technical vacuum. The compression period and temperature may depend on the thickness and the degree of deformation to be achieved here. Because of atmospheric pressure, compression for example normally takes place at approx. 1 atmospheric pressure. Additional pressure may however also be applied for compression, for example an additional 1 to 3 atmospheric pressure. Compression for example takes place for 2 minutes at 200° C. One normally applies a vacuum first and then pressure. "Laminating", "lamination" and "lamination process" should be understood within this application in a customary language sense within the solar cell and solar module production industry.

Various methods for laminating and/or autoclaving may be used for the final shaping of the vehicle body part with a three-dimensionally curved outer shape. A substantially flat structure with solar cells already included in the same may for example be initially produced through laminating and subsequently pressed into a mold with a tool, possibly following prior heating. Alternatively respective layers may be arranged directly on a molding tool and simultaneously pressed into the final mold during laminating. Lamination may take directly on a molding tool here. A structurally supportive, but moldable backing layer such as an aluminum sheet may optionally be provided here. The waste rate of the process is especially low in this way. The vehicle body part produced may be especially light without the supportive backing layer. The support and/or frame component may for example form the supportive backing layer here. Another possibility is to initially press at least one layer onto a tool in the mold, then arrange at least one further layer on top of the same, and to also press this into the mold whilst simultaneously laminating. In this way very thick layers and/or those that are difficult to mold may in particular be used. Deep drawing may for example also be used as a molding method.

The method according to the present disclosure preferably comprises a step of arranging a plurality of solar cells on the trim part blank, in particular a step of arranging a plurality of planar solar cells on the trim part blank. The solar cells are preferably fitted to the trim part blank after the same has been deformed.

Arranging a plurality of solar cells on the trim part blank may be realized by means of a matrix. An especially precise alignment of the solar cells in the trim part may be achieved with the aid of the matrix. If the trim part blank is to be deformed after fitting the solar cells, the solar cells may also be aligned by means of the matrix in such a way that the same are arranged on the trim part blank prior to deforming the trim part blank in such a way that they are arranged in respective cutouts after this deforming and respective solar cells will not be damaged here. The matrix may for example be a film, on which respective points are drawn, where respective solar cells must be arranged. This film may be laid at the back below the trim part blank if this is designed transparently at corresponding points and may be removed and possibly re-used after placing, fitting and/or closing respective cutouts. The matrix may however also be integrated into a film for closing the cutout, which may render the assembly effort especially low. The film materials already mentioned above are consequently suitable.

The method according to the present disclosure may further have a step of electrically connecting the plurality of solar cells, in particular by means of soldering. The electric connection is realized either prior to arranging the solar cells on the trim part blank or after this. A prior connection may for example use respective partly pre-assembled components such as strings of solar cells, which may render production especially cost effective. An electrical connecting of the respective solar cells after placing the same on or in the cutout means that respective position tolerances during such placing may be especially high.

According to the method according to the present disclosure a gap between the at least one solar cell and respective walls of the trim part delimiting associated cutouts may be filled with a silicone gel, wherein a filler opening for the silicone gel preferably lies at a lower end defined by gravity during filling, and a ventilation opening lies at an upper end defined by gravity. The silicone gel is therefore filled into respective cutouts from the bottom upwards against gravity. This may suppress a formation of air bubbles especially well. A highly transparent silicone rubber is preferably filled into the gap here, which vulcanizes into a transparent silicone gel there. Vulcanization may take place at room temperature, but also whilst heating, for example during autoclaving.

A plastic film is preferably arranged on the cutout for closing the same, in particular a thermoplastic film (such as a TPU film), wherein the cutout is sealed with the plastic film arranged thereon, in particular with underpressure, overpressure and/or heating. The materials for films, such as PTFE and ETFE, already mentioned above are also suitable. Underpressure is preferably introduced into a hollow to be closed by the films here and/or overpressure applied to the hollow to be closed from the outer side. Because of the at least one plastic film respective manufacturing tolerances of structurally solid components, which form the cutout, may be relatively high. A support element containing the cutout may for example be produced with a high manufacturing tolerance, whilst flexible plastic films may nevertheless seal the cutout well and compensate for manufacturing tolerances here. Sealing at underpressure, overpressure and/or whilst heating may also be described as autoclaving, wherein overpressure may in particular also be applied outside of the hollow formed by the films. Respective TPU films are especially suitable for internal sealing, for example as two TPU film layers between two polycarbonate discs, as these may melt together when heated and simultaneously fix the polycarbonate discs safely to each other.

The trim part blank preferably has two discs, between which the at least one solar cell is arranged. The discs are preferably deformed as part of the method according to the present disclosure in order to generate the three-dimensionally curved outer side and/or a three-dimensionally curved inside of the trim part. The two discs are preferably deformed prior to arranging the solar cell here, for example by means of a molding tool. The two discs may for example be fixed in their respective position in relation to each other prior to and/or after deforming here, for example by means of a double-sided adhesive tape, preferably a double-sided acrylic adhesive tape. This adhesive tape may also serve as a distancer between the two discs and as a side seal for respective cutouts here.

The molding tool for deforming the trim part blank may also serve as a holding means for autoclaving and/or laminating when closing the respective cutout. Respective elements of the trim part no longer need to be remounted in this way, which may make production especially cost effective and precise.

The method preferably has the following further steps:
arranging a first plastic film on a side facing the cutout of a first one of the two discs;
arranging the at least one solar cell on the first plastic film;
arranging a second plastic film on the at least one solar cell and the first plastic film;
arranging the second disc on the second plastic film or arranging the second plastic film on the second disc;
connecting the first and the second plastic film with each other at least in one part area for closing the at least one cutout, in particular through autoclaving and/or laminating.

The second plastic film may be arranged on the second disc here before the plastic film arranged on the second disc is then placed with the second disc on the first disc and/or on the first plastic film. The cutout may be closed essentially airtight and/or substantially watertight especially easily in this way. The second plastic film may however also be simply placed centrally on the first plastic film and on respective solar cells and/or dropped onto the same. The two discs may be connected with each other by means of the two films here. The respective plastic films are preferably thermoplastic polyurethane films. A respective molding tool may serve as a holding device during autoclaving and/or laminating.

Further advantages, features and details of the present disclosure result from the following description of a preferred embodiment example as well as with reference to the drawings. The features and feature combinations mentioned above in the description as well as those mentioned in the following description of the Figures and/or features and feature combinations shown only in the drawings may be used not only in the respective combination listed, but also in other combinations or in isolation without departing from the scope of the present disclosure.

Further advantages and features of the present disclosure will become clear from the following description of exemplary embodiments. The features described therein and above can be implemented on their own or in combination, provided the features to not contradict one another. It is to be understood that both the foregoing general description and the following detailed description are exemplary and explanatory only and are not restrictive of the subject matter as claimed.

BRIEF DESCRIPTION OF THE DRAWINGS

The above and other aspects of the present disclosure will become more apparent by describing exemplary embodiments in detail below with reference to the accompanying drawings, wherein.

DETAILED DESCRIPTION

As used throughout the present disclosure, unless specifically stated otherwise, the term "or" encompasses all possible combinations, except where infeasible. For example, the expression "A or B" shall mean A alone, B alone, or A and B together. It is stated that a component includes "A, B, or C," then, unless specifically stated otherwise or infeasible, the component may include A, or B, or C, or A and B, or A and C, or B and C, or A and B and C. Expressions such as "at least one of" do not necessarily modify an entity of a following list and do not necessarily modify each member of the list, such that "at least one of A, B, and C" should be understood as including only one of A, only one of B, only one of C, or an An exemplary arrangement is set out in FIG. 1 which shows a motor vehicle 10 in a side view, which has several vehicle body parts 12. Vehicle body parts according to the present disclosure may for example be one or more doors, a bonnet, a roof, a tailgate, a bumper (front and/or rear) and/or one or more fenders (front and/or rear). Individual random sub-combinations or even all of these vehicle body parts may be designed as vehicle body parts according to the present disclosure. A multitude of solar cells 14 each is arranged in these vehicle body parts 12, which may convert incoming sunlight radiation into electrical energy. A respective outer side of the vehicle body part 12 is designed transparently at least in some areas for this purpose, so that respective sunbeams may reach the solar cells 14 and excite these to generate energy.

Figure 1:
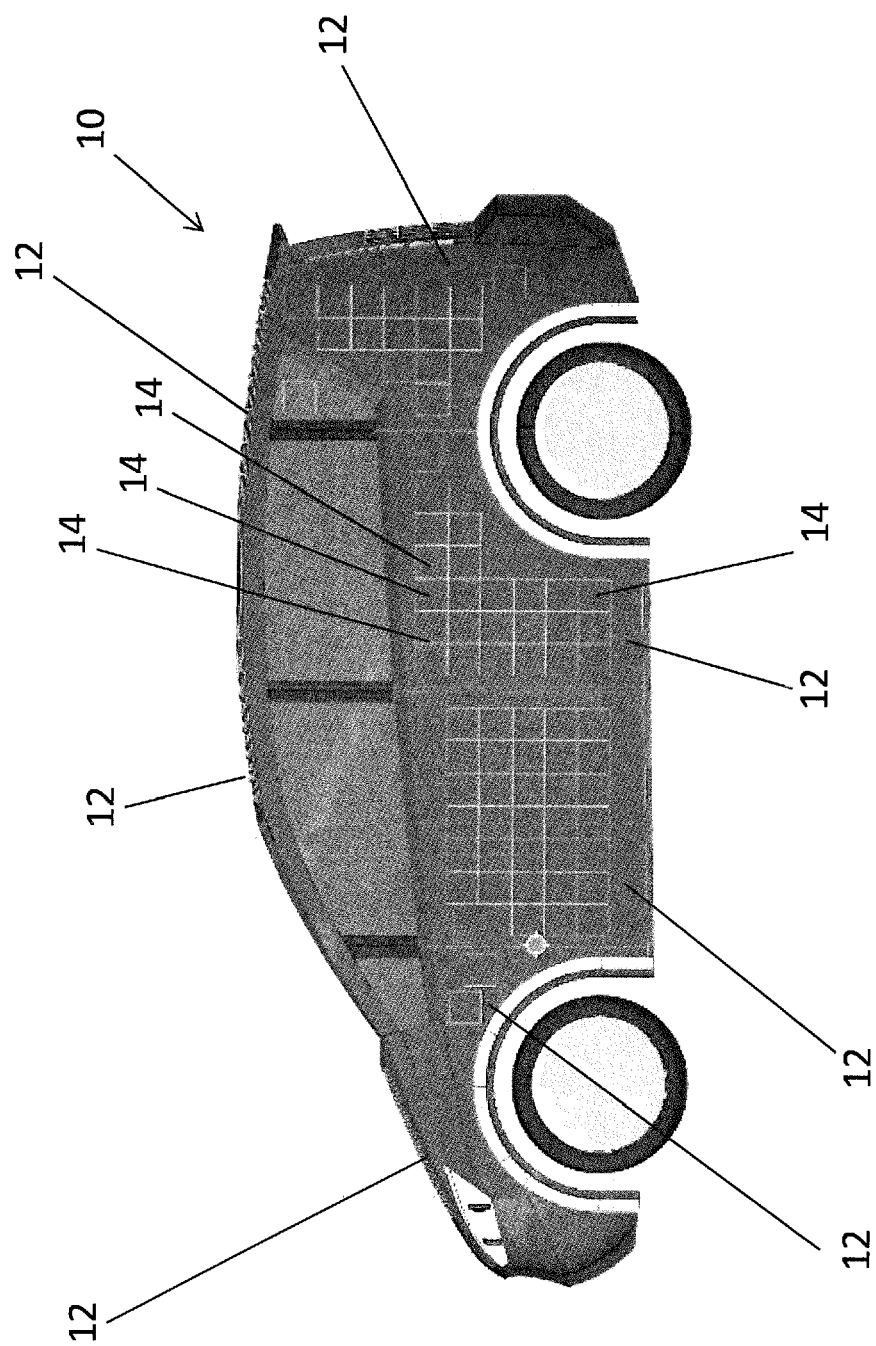
FIG. 1 shows a motor vehicle with several vehicle body parts in a side view.
Figure 2:
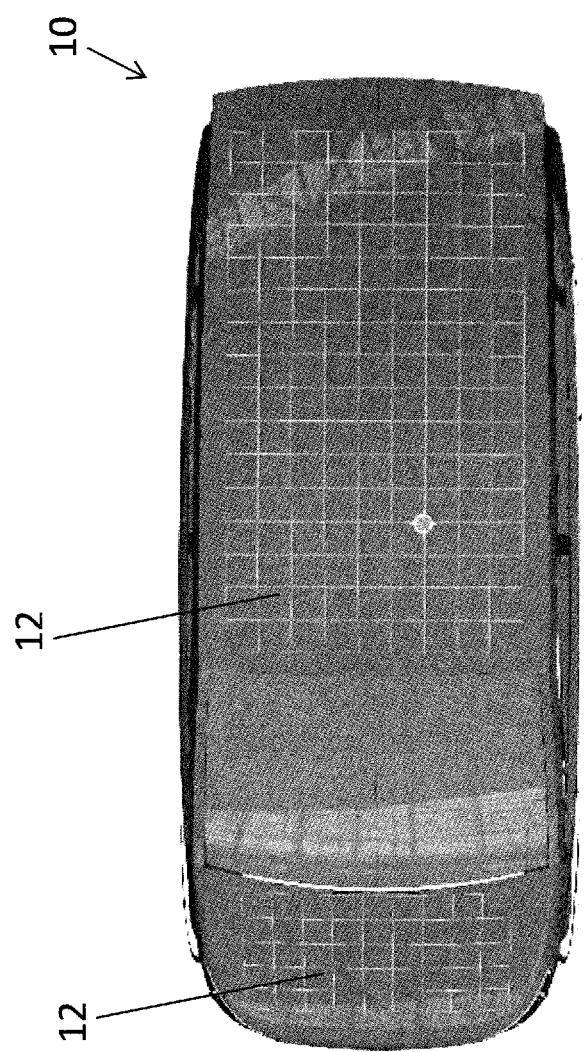
FIG. 2 shows the motor vehicle according to FIG. 1 in a top view.

FIG. 2 shows the motor vehicle 10 according to FIG. 1 in a top view, wherein respective vehicle body parts 12 are also recognizable on the roof and the bonnet of the motor vehicle 10.

It is further recognizable in FIGS. 1 and 2 that respective vehicle body parts 12 have a three-dimensionally curved outer shape at least in some areas. The vehicle body parts 12 form a curved external contour of the motor vehicle in the installed position on the motor vehicle 10 as well in this way. The motor vehicle 10 may consequently be designed aerodynamically and have an elegant appearance.

The solar cells 14 are preferably rigid and planar solar cells here, preferably with respective identical dimensions and characteristics, in particular a respective identical irradiated surface. The solar cells 14 themselves are not adapted to the curved external contour of the motor vehicle 10 or the trim part 20 here, as correspondingly shaped solar cells are very complex and expensive to manufacture. Instead substantially identical planar solar cells 14 are used for all vehicle body parts 12. In order to nevertheless be able to form a three-dimensionally curved external contour with the vehicle body parts 12, the solar cells 14 are arranged in respective cutouts 16, which are for example recognizable in FIGS. 4, 6, 7 and 9. Respective parts of the vehicle body part 12 may have a substantially constant thickness and three-dimensionally curved outer shape thanks to the cutouts 16, wherein sufficient installation space is nevertheless available for arranging of the planar solar cells 14. This means that the planar solar cells 14 may for example be arranged closer to one end of an outer side wall of the cutout 16 than to another end, as they do not follow the curvature of the external contour across a width of the cutout 16. The solar cells 14 do not need to be arranged parallel to respective walls of the cutout 16 either here, which also allows the same to be adapted especially well at an incline to a probable irradiation angle of the sunlight.

Figure 3:
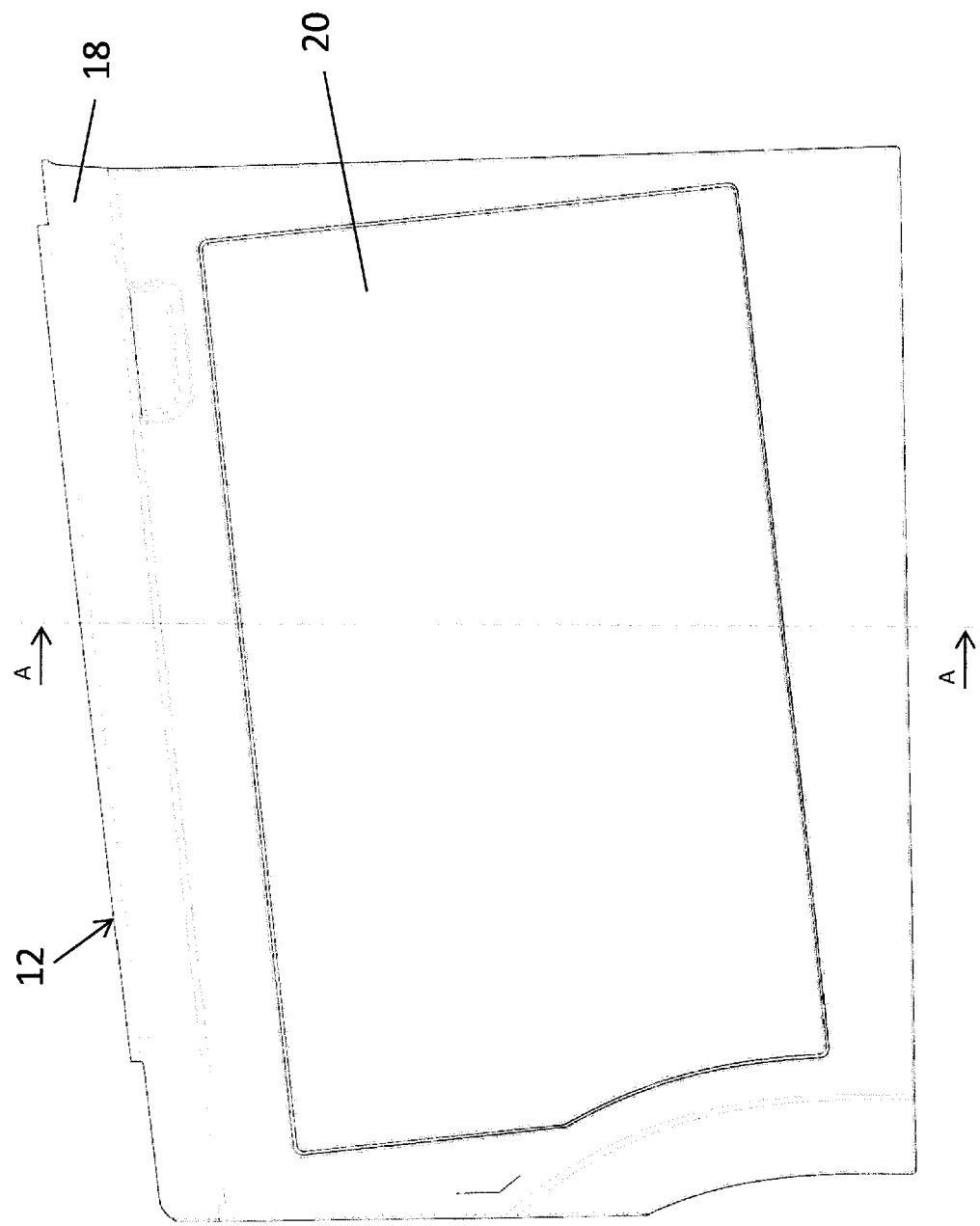
FIG. 3 shows a vehicle body part of the motor vehicle according to FIG. 1 in a side top view.
Figure 4:
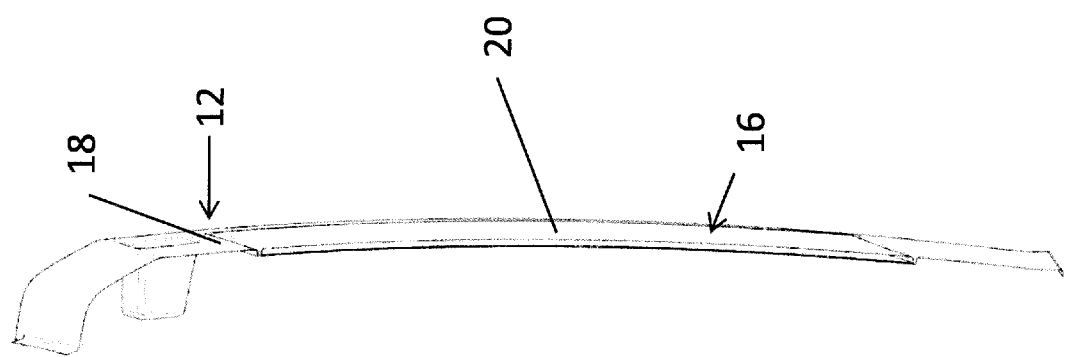
FIG. 4 shows a vehicle body part according to FIG. 3 in a section view.
Figure 5:
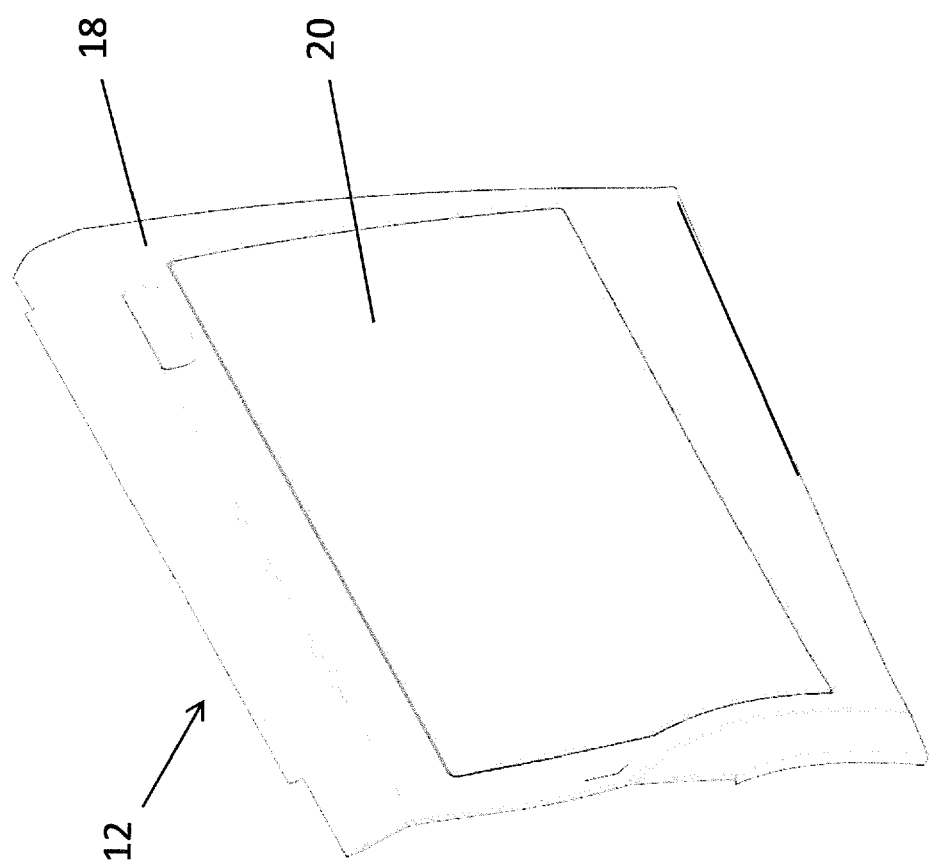
FIG. 5 shows the vehicle body part according to FIG. 3 in a perspective view.

In the side view according to FIG. 3 an example of a vehicle body part 12 of the motor vehicle 10 according to FIG. 1 is shown, wherein this is the left front door of the motor vehicle 10. It is recognizable here that the vehicle body part 12 is a frame component 18 and has a trim part 20 arranged thereon. The frame component 18 may adopt a structurally supportive function here and hold the trim part 20 on the rest of the motor vehicle 10. The frame component 18 is preferably designed as a CFRP component here, which is especially light and rigid. The frame component 18 encloses the trim part 20 in the way of a frame around its outer circumference here. In this way the trim part 20 may support the frame component 18 at least on its main expansion level and additionally reinforce the same. Overall the vehicle body part 12 may therefore be especially light.

Figure 8:
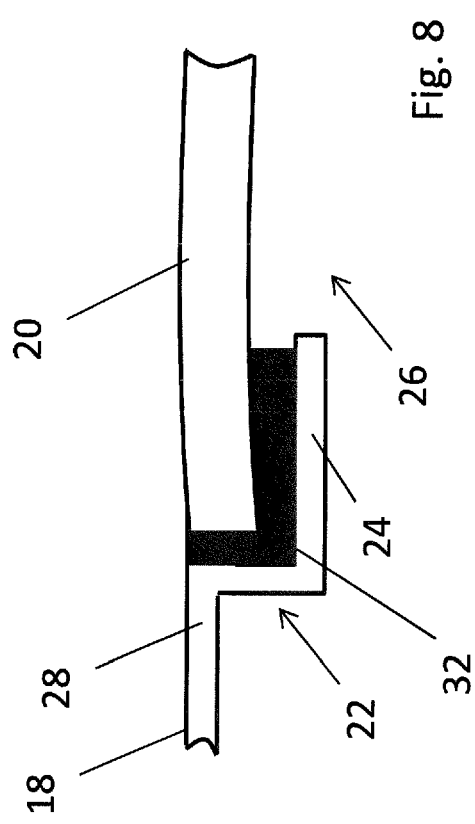
FIG. 8 schematically shows the connection between a frame component and a trim part of the vehicle body part according to FIG. 3 arranged thereon.

The trim part 20 is preferably held on the frame component 18 on a step 22 here, which is for example schematically shown in the section view according to FIG. 8. The frame component 18 has a Z-shaped step 22 here, on the lower leg 24 of which the trim part 20 lies. The lower leg 24 extends below the trim part 20 only some areas here, and a through opening 26 may otherwise be provided in the frame component 18 in the centre of a receiving area for the trim part 20 for reducing weight. The upper leg 28 of the Z-shaped step 22 follows the trim part 20 flush on a level here. This is of particular aerodynamic advantage.

An adhesive 32 may be arranged in a gap 30 between the trim part 20 and the frame component 18, for example an acrylic adhesive. This adhesive 32 may serve not only for fixing the trim part 20 on the frame component 18 but may also enable a compensation of different thermal expansion coefficients. The frame component 18 may for example be made of a carbon fiber reinforced plastic and the trim part 20 substantially of polycarbonate discs. Different thermal expansion coefficients must be compensated for in this case. This is especially easy thanks to the gap 30 and the adhesive 32. Alternatively or additionally a double-sided adhesive tape (such as a double-sided vehicle body adhesive tape between the lower leg 24 and the trim part 20) may be provided.

The trim part 20 may be painted on the back of a side facing the interior of the motor vehicle 10, in particular in color, in order to make the motor vehicle 10 colorful on the outer side for respective observers. The trim part 20 may however for example be equipped with a clear lacquer on the outer side on a side facing incoming light in order to protect respective components, but nevertheless not to hinder light falling onto the solar cells 14. A corresponding color or a corresponding clear lacquer may also be applied to the frame component 18 for a consistent appearance.

The cutout 16 of the trim part 20 is preferably closed in a substantially airtight and substantially watertight fashion. Respective solar cells 14 may be protected against environmental influences in this way.

Figure 6:
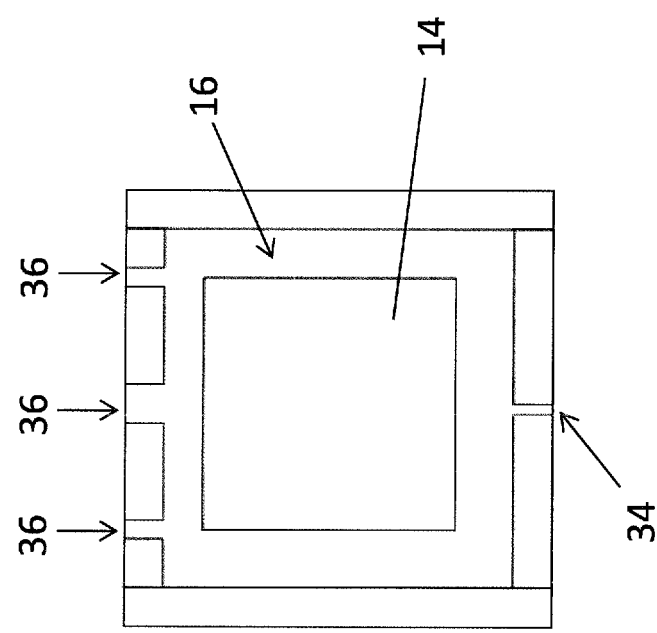
FIG. 6 schematically illustrates a part of a production process of the vehicle body part according to FIG. 3.

It may for example be envisaged to fill a gap in the cutout 16 between the solar cell 14 and the respective walls of the cutout 16 with a silicone gel for this purpose. A silicone rubber may be filled into the cutout 16 after arranging the solar cells 14 for this purpose, which then vulcanizes there. The silicone rubber is preferably inserted into the cutout 16 via one or more lower filler openings 34 against gravity here—as shown in FIG. 6. The insertion against gravity may prevent for formation of air bubbles especially reliably. At least one ventilation opening 36 should be provided here, preferably at an upper end, through which respective air located in the cutout 16 may exit during filling. These respective filler openings 34 and ventilation openings 36 may also be closed after filling, or may be sealed by the vulcanized silicone gel itself.

Figure 7:
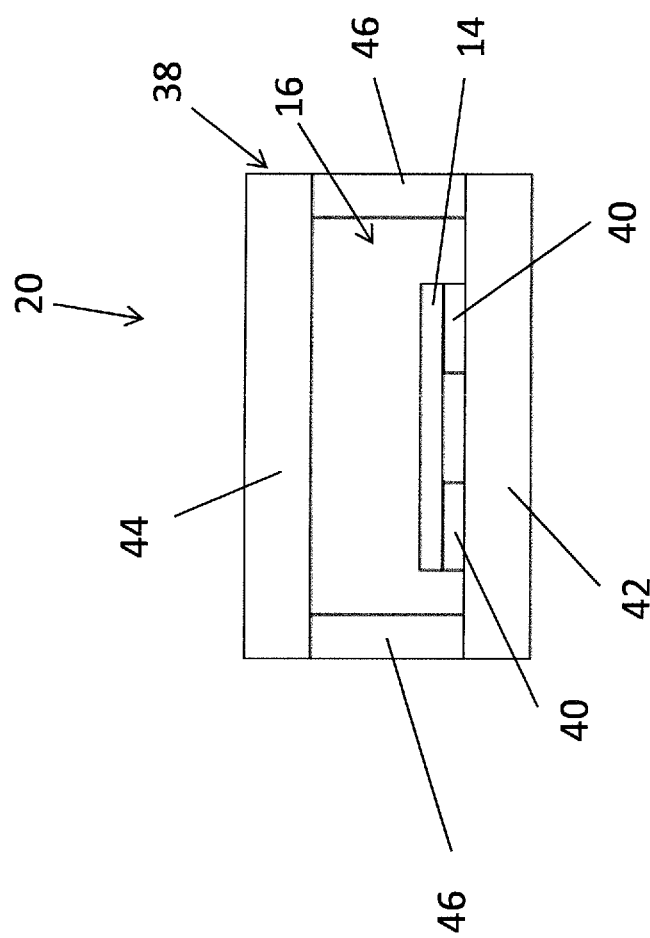
FIG. 7 illustrates a construction of the vehicle body part according to FIG. 3 in a schematic section view.

As shown in FIG. 7 the trim part 20 may for example have two discs here, which together form a support element 38. The solar cell 14 is for example fitted to a first inside polycarbonate disc 42 by means of its double-sided acrylic adhesive tape 40. In addition a second polycarbonate disc 44 is arranged in the direction of the outer side of the vehicle body part 12, which is fitted to the first polycarbonate disc 42 with respective double-sided acrylic adhesive tapes 46. The acrylic adhesive tapes 46 not only serve as distancers here, but may also seal the cutout 16 at least in part, in particular at the side. The polycarbonate discs 42, 44 may for example have a thickness of 1 mm to 4 mm here, preferably 2 mm to 3 mm or 2.5 mm, and the cutout 16 may for example have a height of 1 mm to 4 mm, preferably 1 mm to 3 mm, for example approximately 2 mm, in the section view according to FIG. 7.

Figure 9:
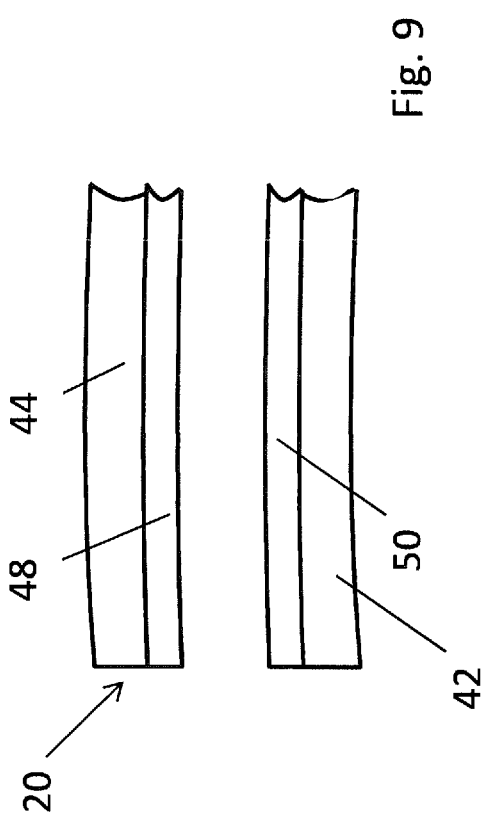
FIG. 9 illustrates a further part of a production process of the vehicle body part according to FIG. 3 in a schematic section view.

Additionally or alternatively the trim part 20 may also have a layer construction, which is demonstrated in FIG. 9. A thermoplastic polyurethane film 50 or 48 is arranged on the respective inside on the side of the first polycarbonate disc 42 and the second polycarbonate disc 44 facing the cutout 16 here. Respective cutouts 16 with solar cells 14 located therein may be encapsulated in an airtight and watertight fashion by means of these TPU films 50, 48. The trim part 20 is for example inserted into a vacuum bag and autoclaved for 3 hours at 120° for this. In respective part areas in which no cutout 16 is arranged and the first and the second TPU films 50, 48 contact each other, these melt together and close the cutout 16 in this way. The two polycarbonate discs 42, 44 are simultaneously connected with each other by means of the TPU films 50, 48 here.

In an example of the production process the polycarbonate discs 42, 44 are made available as planar discs. Both of these planar discs are deformed into the three-dimensionally curved shape according to the external contour of the motor vehicle 10 by means of a molding tool, and optionally by means of additional heating. With this deformation respective domes are inserted are simultaneously introduced into the polycarbonate discs 42, 44. One of the two TPU films 50, 48 is subsequently for example laid onto the associated polycarbonate disc 42, 44 and the respective solar cells 14 arranged thereon with the aid of a matrix. In line with a predetermined circuitry the solar cells 14 are then electrically connected with each other and at least one electric output is provided at the trim part 20, by means of which electrical energy may be supplied to respective energy stores of the motor vehicles 10. The other one of the two TPU films 50, 48 is then applied, followed by the other one of the two polycarbonate discs 42, 44. This layer construction preferably continues to be held on at least one of the molding tools of the molding process of the polycarbonate discs 42, 44. The entire layer construction may then be introduced into a vacuum bag and autoclaved, for example for 3 hours at 120°. The solar cells 14 are then sealed in the cutouts 16 in an air- and watertight fashion and protected against environmental influences, and the respective polycarbonate discs 42, 44 are firmly connected with each other. The trim part 20 produced in this way may then be glued into the Z step of the frame component 18. Thanks to the sealing of the solar cells 14 the assembly is especially easy here, as the solar cells 14 are now already protected against damage and contamination and may be inserted into the frame component 18 in the way of a module without particular precaution measures.

The solar cells 14 may for example be provided as solar cell strings that are already electrically connected with each other here. A string may equal a series of solar cells 14 in one trim part 20 here. Such a string may then be inserted together into a respective common cutout 16 of the trim part 20, so that several solar cells 14 are directly arranged in a correct arrangement in the trim part 20. Several strings may then be electrically connected with each other.

Have described aspects of the present disclosure in detail, it will be apparent that further modifications and variations are possible without departing from the scope of the present disclosure. All matter contained in the above description and shown in the accompanying drawings shall be interpreted as illustrative and not in a limiting sense.

The invention claimed is:

1. A vehicle body part of a motor vehicle, comprising:
   at least one frame component; and
   at least one trim part arranged on the at least one frame component, the at least one trim part comprising at least one cutout defined by delimiting walls and configured to be closed in an essentially airtight and essentially watertight manner, the cutout configured to accommodate multiple rigid planar solar cells arranged therein electrically connected to one another in order to generate electrical energy, the trim part further comprising an outer side comprising at least in a region adjacent to one of the solar cells a three-dimensionally curved outer shape such that in an installed position on the motor vehicle said outer shape forms a part of a vehicle outer contour;
   wherein the at least one frame component is an essentially structurally supporting component of the vehicle body part and configured to support and brace the trim part in the installed position;
   wherein the trim part has an in comparison essentially smaller structurally supporting proportion;
   wherein the installed position is not on the roof;
   wherein the at least one frame component is made from fiber reinforced plastics and the trim part is made of polycarbonate discs, and
   wherein the cutout further comprises a gap extending between at least one of the solar cells and the walls, the gap filled with a silicone gel.

2. The vehicle body part according to claim 1, wherein the outer side of the cladding part essentially connects flush to an outer side of the frame component.

3. The vehicle body part according to claim 1, wherein the cladding part comprises a supporting element that is curved at least in regions in accordance with the curved outer contour and the at least one solar cell is arranged in or on said supporting element.

4. The vehicle body part according to claim 3, wherein the supporting element is formed from at least two sheets, wherein an outer of the sheets forms the outer side of the cladding part and an inner of the sheets forms an inner side that is remote from the outer side, wherein the recess is embodied between the two sheets.

5. The vehicle body part according to claim 4, wherein a free space between the at least one solar cell and respective walls of the cladding part that delimit the allocated recess is filled with a silicone gel.

6. The vehicle body part according to claim 4, wherein the recess is delimited by means of two films comprising thermoplastic polyurethane films that are arranged on the supporting element and that are connected to one another so as to seal the recess.

7. The vehicle body part according to claim 1, wherein the frame component comprises a receiving region having a step, wherein the cladding part is arranged in the receiving region.

8. The vehicle body part according to claim 7, wherein the step of the frame component is embodied in an essentially Z-shaped, wherein an upper limb of the Z-shaped step forms the outer side of the frame component and said outer side essentially connects flush to the cladding part, and wherein a lower limb of the step forms a resting surface for the cladding part.

9. The vehicle body part according to claim 6, wherein the two films comprise thermoplastic polyurethane films.

10. The vehicle body part according to claim 1, wherein the vehicle body part is at least one of a door, a bonnet, a tailgate, a bumper, and a fender.

11. The vehicle body part according to claim 1, wherein the fiber reinforced plastics are carbon fiber reinforced plastics or glass fiber reinforced plastics.

* * * * *